(12) United States Patent
Lee et al.

(10) Patent No.: US 10,930,418 B2
(45) Date of Patent: Feb. 23, 2021

(54) MAGNETIC SHIELDING UNIT FOR MAGNETIC SECURITY TRANSMISSION, MODULE COMPRISING SAME, AND PORTABLE DEVICE COMPRISING SAME

(71) Applicant: Amosense Co., Ltd., Cheonan-si (KR)

(72) Inventors: Woong Yong Lee, Incheon (KR); Seong Tae Kim, Daegu (KR); Kyung Pyo Hong, Suwon-si (KR)

(73) Assignee: Amosense Co., Ltd., Cheonan-si (KR)

( * ) Notice: Subject to any disclaimer, the term of this patent is extended or adjusted under 35 U.S.C. 154(b) by 404 days.

(21) Appl. No.: 15/764,564

(22) PCT Filed: Sep. 30, 2016

(86) PCT No.: PCT/KR2016/011013
§ 371 (c)(1),
(2) Date: Mar. 29, 2018

(87) PCT Pub. No.: WO2017/057972
PCT Pub. Date: Apr. 6, 2017

(65) Prior Publication Data
US 2018/0315527 A1    Nov. 1, 2018

(30) Foreign Application Priority Data
Sep. 30, 2015    (KR) .................. 10-2015-0138059

(51) Int. Cl.
*H01F 1/10*    (2006.01)
*H01F 10/20*   (2006.01)
(Continued)

(52) U.S. Cl.
CPC .............. *H01F 1/10* (2013.01); *H01F 10/20* (2013.01); *H01F 27/36* (2013.01); *H01F 38/14* (2013.01);
(Continued)

(58) Field of Classification Search
None
See application file for complete search history.

(56) References Cited

U.S. PATENT DOCUMENTS 6,338,900 B1    1/2002  Tada et al.
9,640,304 B2 *  5/2017  Yoo ......................... B32B 27/36
(Continued)

FOREIGN PATENT DOCUMENTS

| CN | 101386530 A | 3/2009 |
|----|-------------|--------|
| CN | 102428608 A | 4/2012 |

(Continued)

OTHER PUBLICATIONS

Derwent Abstract of JP 08-012904 A. (Year: 1996).*
International Search Report dated Jan. 12, 2017 for International Application No. PCT/KR2016/011013; 4 Pages.

*Primary Examiner* — Kevin M Bernatz
(74) *Attorney, Agent, or Firm* — Daly Crowley Mofford & Durkee, LLP

(57) ABSTRACT

Disclosed is a magnetic field shielding unit for magnetic security transmission. The magnetic field shielding unit for magnetic security transmission includes a magnetic shielding layer formed of fragments of ferrite containing magnesium oxide (MgO) shredded to improve flexibility of the magnetic field shielding unit. The ferrite containing magnesium oxide has a real part ($\mu'$) of the complex permeability of 650 or more at a frequency of 100 kHz. Accordingly, it is possible to prevent influence of a magnetic field on components of a mobile terminal device or a body of a user who uses the same, and to further increase the characteristics of the combined antennas even if the magnetic field shielding unit is combined with various kinds and purposes of antennas having various structures, shapes, sizes and intrinsic characteristics (inductance, resistivity, etc.).

11 Claims, 5 Drawing Sheets

(51) Int. Cl.
*H02J 50/70* (2016.01)
*H01Q 7/00* (2006.01)
*H04B 5/00* (2006.01)
*H01Q 21/30* (2006.01)
*H02J 50/12* (2016.01)
*H04B 7/06* (2006.01)
*H01F 27/36* (2006.01)
*H02J 50/10* (2016.01)
*H02J 50/20* (2016.01)
*H01F 38/14* (2006.01)
*H05K 9/00* (2006.01)
*H01Q 3/44* (2006.01)
*H01Q 1/38* (2006.01)

(52) U.S. Cl.
CPC .............. *H01Q 7/00* (2013.01); *H01Q 21/30* (2013.01); *H02J 50/10* (2016.02); *H02J 50/12* (2016.02); *H02J 50/20* (2016.02); *H02J 50/70* (2016.02); *H04B 5/00* (2013.01); *H04B 5/0031* (2013.01); *H04B 5/0037* (2013.01); *H04B 5/0081* (2013.01); *H04B 7/0608* (2013.01); *H05K 9/0075* (2013.01); *H01Q 1/38* (2013.01); *H01Q 3/44* (2013.01); *Y10T 428/32* (2015.01)

(56) References Cited

U.S. PATENT DOCUMENTS

| | | | |
|---|---|---|---|
| 10,714,247 B2 * | 7/2020 | Okano | H01F 1/342 |
| 2002/0114962 A1 * | 8/2002 | Kawasaki | H01G 4/40 |
| | | | 428/469 |
| 2004/0036559 A1 * | 2/2004 | Sue | H01L 23/552 |
| | | | 333/247 |
| 2005/0034633 A1 * | 2/2005 | Lai | C04B 35/265 |
| | | | 106/313 |
| 2008/0224937 A1 * | 9/2008 | Kimura | H01F 1/344 |
| | | | 343/787 |
| 2008/0258840 A1 * | 10/2008 | Sato | H01P 1/20 |
| 2009/0021337 A1 * | 1/2009 | Sato | H01F 17/0013 |
| | | | 336/234 |
| 2011/0018671 A1 * | 1/2011 | Kamei | C03C 3/066 |
| | | | 336/200 |
| 2011/0186324 A1 | 8/2011 | Hur et al. | |
| 2015/0302958 A1 * | 10/2015 | Sadai | H01F 1/01 |
| | | | 428/172 |
| 2016/0284453 A1 * | 9/2016 | Okano | C04B 35/638 |
| 2020/0253098 A1 * | 8/2020 | Lee | C04B 35/03 |

FOREIGN PATENT DOCUMENTS

| | | | |
|---|---|---|---|
| JP | 08012904 A | * | 1/1996 |
| JP | 10-229007 A | | 8/1998 |
| JP | 2002-104873 A | | 4/2002 |
| JP | 2007-295557 A | | 11/2007 |
| KR | 10-0898587 B1 | | 5/2009 |
| KR | 2010-0028365 A | | 3/2010 |

* cited by examiner

MAGNETIC SHIELDING UNIT FOR MAGNETIC SECURITY TRANSMISSION, MODULE COMPRISING SAME, AND PORTABLE DEVICE COMPRISING SAME

CROSS-REFERENCE TO RELATED APPLICATION

This application is a U.S. National Stage of PCT/KR2016/011013 filed in the Korean language on Sep. 30, 2016, entitled: "Magnetic Shielding Unit For Magnetic Security Transmission, Module Comprising Same, And Portable Device Comprising Same" which application claims priority to Korean Application No. 10-2015-0138059 filed on Sep. 30, 2015, which applications are each hereby incorporated herein by reference in their entireties.

BACKGROUND

1. Technical Field

The present disclosure relates to a magnetic field shielding unit, and more particularly, to the magnetic field shielding unit for a magnetic security transmission, a module including the same, and a portable device.

2. Discussion of the Related Art

Generally, an antenna is a device that converts an electric signal into a radio wave signal and classified into a dielectric antenna using dielectric characteristics and a magnetic antenna using magnetic properties. All antennas may be used in various application fields, and their efficiency depends on their shapes and structures. Conventionally, researches on dielectric antennas using high permittivity materials were actively conducted. Now, with the use of higher frequencies, the problem of performance degradation of antennas due to miniaturization has emerged. Studies on magnetic materials having high magnetic permeability are actively conducted for the high-permittivity materials. In recent years, attempts have been made to integrate various functions such as Near Field Communication (NFC), Wireless Power Transmission (WPT), Magnetic Security Transmission (MST), and the like through various portable terminal devices (smart phone, tablet PC, and the like) utilizing these antennas.

The NFC, WPT and MST functions are performed by transmitting and receiving electromagnetic signals between a transmitting module and a receiving module. The electromagnetic wave signals are not only present between the transmitting module and receiving module but also are leaked to the surrounding. Leaked electromagnetic wave may make problems such as a reduction of the transmission/reception efficiency, a shorten transmission/reception distances, and an adverse affectation for users using other components and devices disposed around the module.

To solve these problems, a magnetic field shielding material may be provided in the module to shield the other parts in the device from the magnetic field. In addition, the magnetic field shielding material induces the concentration of the magnetic field between the transmitting and receiving parts, thereby improving the transmission and reception and preventing the deterioration of functions of other parts due to the magnetic field.

The higher the magnetic permeability of the magnetic field shielding material, the better the transmission/reception efficiency. The magnetic permeability varies depending on the type of the magnetic body included in the magnetic field shielding material. In general, a magnetic body of any specific composition may exhibit different permeability characteristics depending on the manufacturing process such as sintering temperature etc., and have a tendency with a large fluctuation width in permeability for each frequency band. Therefore, for improving the performance of the antenna provided in the transmission/reception module having the specific frequency band as an operating frequency, it is advantageous to use the magnetic field shielding material having an excellent magnetic permeability characteristic in the specific frequency band.

However, the antennas that perform the NFC, WPT, and MST functions have different frequency bands within the wide frequency band of 100 kHz to 13.56 MHz as the operating frequency. Any magnetic body does not have an excellent magnetic permeability throughout such a wide frequency band.

Recently, there is an attempt that a magnetic field shielding material including a magnetic body having an excellent magnetic permeability at a frequency corresponding to the operating frequency of each antenna is selected for each antenna, thereby integrating a plurality of magnetic shielding materials. However, the integrated magnetic shielding materials may become thick. This is undesirable considering the tendency of small size and slim thickness in commercialized portable devices.

In addition, the conventional thin magnetic field shielding material may not avoid breakage of the magnetic body due to external impact. When the magnetic body is broken and separated into fragments, the magnetic properties may exhibit lower than the initial designed physical property. Therefore, the function of the module may not be exerted at a desired level.

Therefore, when a magnetic field shielding material is provided in a portable electronic device having a small size and slim thickness, each performance of heterogeneous antennas provided for the multifunction in one module should be simultaneously improved. In addition, it is required to develop the integrated module capable of preventing deterioration of functions due to the external impact.

SUMMARY

To solve the above problem and defects, it is an object of the present disclosure to provide a magnetic field shielding unit for magnetic security transmission that can prevent the influence of a magnetic field on the components of a mobile terminal or the like or a human body of a user, at the same time increase the characteristics of the respective antennas to be integrated even if various kinds and/or purposes of antennas having various structures, shapes, sizes and intrinsic characteristics (inductance, resistivity, etc.) are integrated, and can continuously develop physical properties related to magnetic characteristics which are initially designed.

It is another object of the present disclosure to provide a magnetic field shielding unit for magnetic security transmission capable of simultaneously and excellently exhibiting characteristics of a NFC antenna and a MST antenna by using only the magnetic field shield unit according to the present disclosure.

Furthermore, it is still another object of the present disclosure to provide the magnetic security transmission module and the portable device including the same capable of significantly increasing the transmission efficiency and the transmission/reception distance of a desired signal through the magnetic field shielding unit according to the present disclosure.

According to an aspect of the present disclosure, there is provided a magnetic field shielding unit for magnetic security transmission that includes a magnetic field shielding layer including fragments of ferrite containing magnesium oxide (MgO) shredded to improve flexibility of the magnetic field shielding unit. The ferrite containing magnesium oxide has a real part ($\mu'$) of complex permeability of 650 or more at a frequency of 100 kHz.

In an embodiment of the present disclosure, the magnetic field shielding unit may further include a protective member disposed on one surface of the magnetic field shielding layer and an adhesive member disposed on the other surface of the magnetic field shielding layer.

In an embodiment of the present disclosure, the ferrite containing magnesium oxide may have a real part ($\mu'$) of the complex permeability of 1000 or more at a frequency of 100 kHz.

In an embodiment of the present disclosure, the ferrite containing magnesium oxide may have an imaginary part ($\mu''$) of the complex permeability of 50 or less at a frequency of 100 kHz.

In embodiments of the present disclosure, the ferrite containing magnesium oxide may have a real part ($\mu'$) of a complex permeability of 650 or more at a frequency of 200 kHz, and a real part ($\mu'$) of the complex permeability of 140 to 236 at a frequency of 13.56 MHz. Here, the ferrite containing magnesium oxide may have an imaginary part ($\mu''$) of the complex permeability 50 or less at the frequency of 200 kHz, and an imaginary part ($\mu''$) of the complex permeability 400 or less at the frequency of 13.56 MHz.

In an embodiment of the present disclosure, the fragments of ferrite may have irregular shapes, and a part of fragments of the ferrite may have a curved shape, at least one side of which is not a straight line but a curved line. Preferably, a part of fragments having at least a curved shape may account for 45% or more, further preferably, 60% or more of the total number of the fragments of ferrite.

In an embodiment of the present disclosure, the average diameter of the fragments of ferrite may be 100 to 2000 µm.

In an embodiment of the present disclosure, the ferrite may include a magnesium oxide of 3 mol % to 12 mol %, and further include a copper oxide of 8 mol % to 14 mol %, a nickel oxide and a zinc oxide. The contents of the nickel oxide and the zinc oxide may be the values such that a ratio calculated by following equation is 3.6 or more.

Content of the zinc oxide in the ferrite (mol %)/Content of the nickel oxide in the ferrite (mol %)

In an embodiment of the present disclosure, the ferrite may include a magnesium oxide of 3 mol % to 12 mol % and an iron oxide of 46 to 52 weight %, further include a copper oxide 8 mol % to 14 mol %, a nickel oxide of 1 mol % to 10 mol %, and a zinc oxide of 25 mol % to 32 mol %.

In an embodiment of the present disclosure, the fragments of ferrite may include the 30% or more fragments having a shape rate of 8.0 or less according to the following equation.

Shape rate=Diameter of circumscribed circle of a fragment (µm)/Diameter of inscribed circle of a fragment (µm)

According to an aspect of the present disclosure, there is provided a magnetic security transmission module that includes an antenna unit having a magnetic security transmission antenna; and a magnetic field shielding unit for the MST according to the present disclosure, disposed on one surface of the antenna unit to improve characteristics of the antenna and condense a magnetic field toward the antenna.

In an embodiment of the present disclosure, the antenna unit may further include at least one of a WPT antenna and an NFC antenna.

In an embodiment of the present disclosure, the present disclosure may provide a portable device including a MST module according to the present disclosure as a receiving module.

According to embodiments of present disclosure, the magnetic shielding unit may prevent the influence of a magnetic field on each component of the portable terminal device or a human body of a user, and may remarkably increase the characteristics of each of the integrated antennas even if various kinds and/or purposes of antennas having various structures, shapes, sizes and intrinsic characteristics (for example, inductance, resistivity, and the like) are integrated.

Meanwhile, even if the magnetic body itself has a high brittleness, the flexibility of the magnetic field shielding unit is remarkably excellent. Thus even if the magnetic field shielding unit is thinned, the change or deterioration of physical properties such as the initial designed permeability due to the storage, transportation, adhering to the adhered of the shielding unit, and additional cracks of the magnetic body during use of the electronic device provided with a thing to be adhered can be prevented.

Furthermore, the magnetic field shielding unit according to the present disclosure can singly maintain and increase not only the antenna characteristics for the MST but also the antenna characteristics for the NFC antenna although magnetic field shielding unit is not combined with a heterogeneous sheet having different permeability characteristics in a predetermined frequency band. Thus, it may be very advantageous to realize a slim module and a portable device. Furthermore, the magnetic field shielding unit may be widely applied to various electronic devices such as mobile devices, smart home appliances, or internet of things devices as it can significantly increase transmission efficiency and transmission distance.

BRIEF DESCRIPTION OF THE DRAWINGS

FIG. 5 is a view showing a manufacturing process using the shredding device for shredding a ferrite sheet through unevenness provided on a roller, and FIG. 6 is a view showing a manufacturing process using the shredding device for shredding the ferrite sheet through metal balls provided on a support plate.

DETAILED DESCRIPTION OF THE EMBODIMENTS

Figure 1:
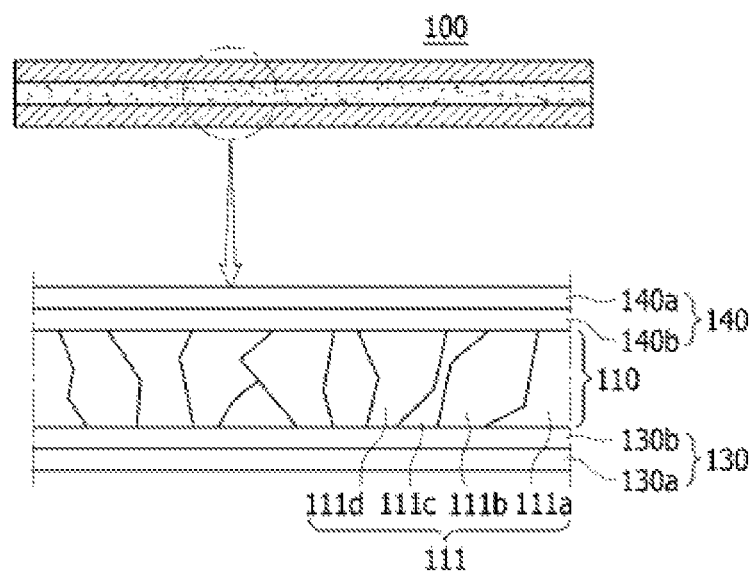
FIG. 1 is a sectional view of a magnetic field shielding unit for MST according to an embodiment of the present disclosure.

Hereinafter, exemplary embodiments of the present disclosure will be described in detail with reference to the accompanying drawings, which will be readily apparent to those skilled in the art to which the present disclosure pertains. The present disclosure may be embodied in many different forms and is not limited to the embodiments described herein. In the drawings, parts not relating to the description are omitted for clarifying the present disclosure, and the same reference numerals are assigned to the same or similar components throughout the specification.

As shown in FIG. 1, the magnetic field shielding unit 100 for MST according to an embodiment of the present disclosure may include a magnetic field shielding layer 110. The magnetic field shielding layer 110 may be formed of ferrite fragments 111 containing magnesium oxide. The magnetic field shielding unit 100 may further include a protection member 140 disposed on top surface of the magnetic field shielding layer 110 and a first adhesive member 130 disposed on the bottom surface of the magnetic field shielding layer 110. The first adhesive member 130 may include a first adhesive layer 130b and a releasing film 130a for protecting the first adhesive layer 130b until the magnetic shielding unit 100 is attached to the adhered.

First, the magnetic field shielding layer 110 may include fragments of ferrite 111 which may be formed by shredding a ferrite sheet containing magnesium oxide to improve the flexibility of the magnetic field shielding unit.

In order to make the magnetic field shielding unit slimmer and thinner, thin magnetic body may be advantageous. The ferrite containing magnesium oxide may be easily broken. When the thickness of the ferrite sheet is thin, the ferrite sheet may be cracked even by a weak external force. Therefore, having been cracked, the ferrite sheet may have changed the magnetic properties such as the magnetic permeability compared to those prior to being cracked.

If the fine fragmentation of the ferrite sheet is intensified, its magnetic property is remarkably deteriorated, so that its initial set values of the physical properties may not be maintained.

In addition, the magnetic field shielding unit having a thin ferrite structure is required to be handled to prevent cracking, when it is stored, transported, and put into the assembly process, but such handling may significantly reduce workability. Specifically, the magnetic field shielding unit may be disposed on the surface on which the antenna is formed, and may be adhered to the surface on which the antenna is formed in order to improve the antenna characteristics and to prevent the magnetic field shielding unit from escaping. Referring to FIG. 1, the magnetic field shielding unit 100 may be attached to a surface to be adhered (not shown) through the first adhesive member 130. To this end, the removal of the releasing film 130a for protecting the first adhesive layer 130b of the first adhesive member 130 may be preceded. However, in order to remove the releasing film 130a from the magnetic field shielding unit 100, an external force may be required with equal to or higher than a certain level. When the thickness of the ferrite sheet is very thin, the ferrite sheet may be easily cracked even by an external force for removing the releasing film 130a. Therefore, even when peeling off the releasing film 130a, a large amount of work load may be applied to this job and it cause to a lower workability. In addition, even when a portable device is manufactured with great efforts to prevent cracks from occurring in the ferrite sheet, the ferrite sheet may be cracked or broken by an impact due to dropping of the portable device during using. Therefore, there is a problem in that it may not guarantee transmission/reception efficiency and transmission/reception distance range of various data signals including a desired level of magnetic security data and wireless power signals.

However, the magnetic field shielding unit 100 according to one embodiment of the present disclosure may be remarkably improved in flexibility. The reason is that the ferrite containing magnesium oxide, which is magnetic material, is provided in shredded and fragmented state at the beginning. Even if the thickness of the magnetic field shielding unit is thinned, the risk that cracks may be further generated in the fragments of ferrite due to the external force can be blocked at its source. In addition, the ferrite may be provided in the magnetic field shielding unit in the fragmented state, and its physical properties may be designed such that the magnetic field shielding unit including the ferrite in the fragmented state may exhibit excellent characteristics in the MST. Since the initial physical property value may be continuously maintained in the manufacturing stage of the finished product to which the magnetic field shielding unit is installed and in the using stage of the finished product, it may be possible to fundamentally eliminate deterioration of the physical property due to the deterioration caused by unintentional fragmentation occurring in the magnetic field shielding unit having the ordinary non-shredded magnetic material and as a result of this, significant reduction in the performance of power signal transmission and reception.

Figure 2:
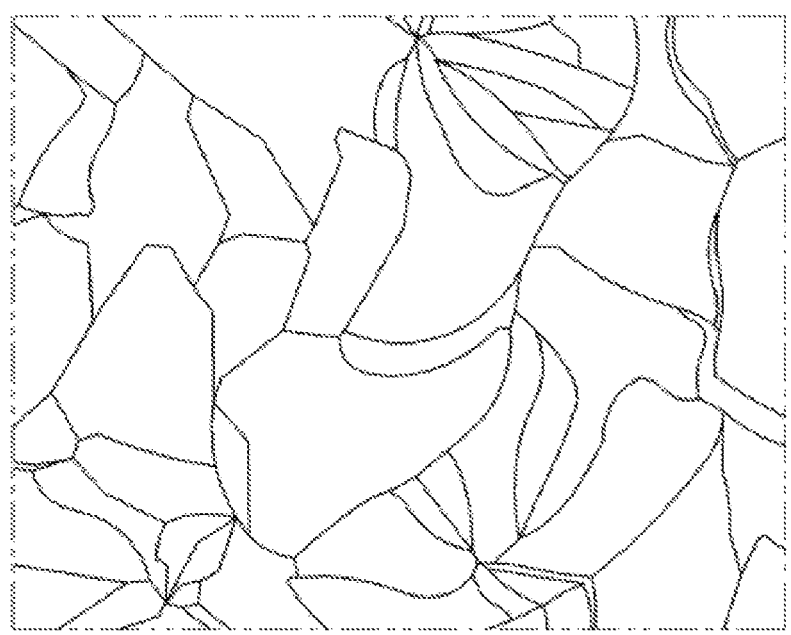
FIG. 2 is a schematic view showing shapes of fragments of ferrite observed on one surface of a magnetic field shielding layer including the fragments of ferrite in a magnetic shielding unit according to an embodiment of the present disclosure.

On the other hand, the fragments of ferrite containing magnesium oxide 111 may have irregular shapes. However, the gap between fragments may cause a magnetic leakage and thus result in deterioration of physical properties. Therefore, it is beneficial to ensure that there are no gaps between the fragments. In this case, unintended ferrite fragmentation may occur during the shielding unit warping or bending. In this case, the physical properties may fluctuate or deteriorate. In order to prevent this, shredding of the ferrite sheet may be performed such that at least one side of a part of the fragments may have a curved shape (refer to FIG. 2). Further, if the magnetic field shielding layer includes the fragments of ferrite of which one side is curved, collision or friction between adjacent fragments can be reduced when the magnetic field shielding unit is bent. There is an advantage that additional fine fragmentation may be prevented even when an external force is applied to the magnetic field shielding unit.

More preferably, the number of the fragments having at least one curved shape may be 45% or more, and further preferably, 60% or more of the total number of fragments in the magnetic field shield layer. If the number of fragments having at least one curved shape is less than 45% of the total number of fragments, the magnetic field shielding layer including the fragments having such a shape may decrease flexibility. Additional fragmentation may be caused by an external impact, which may result in deterioration of properties such as reduction of permeability of the magnetic field shielding unit.

In addition, the average diameter of the fragments of ferrite containing magnesium oxide 111 may be 100 to 2000

μm. If the average diameter exceeds 2,000 μm, additional fracture of the fragments and generation of fragments may be increased, and thus it may be difficult to maintain the initial designed physical properties of the magnetic field shielding unit. If the average diameter of the fragments is less than 100 μm, it is necessary to select a ferrite having a remarkably high magnetic property value such as magnetic permeability before performing the shredding. However, as there is a limitation of manufacturing the ferrite having high permeability, it is difficult to design the initial properties of the magnetic field shielding unit to the desired level. On the other hand, the average diameter of the fragments may be a result measured based on the volumetric average diameter measured by a laser diffraction grain size distribution meter.

In order to prevent further breakage and fragmentation of the fragments of ferrite, the fragments of ferrite containing magnesium oxide 111 may preferably include 30% or more fragments having a shape rate of 8.0 or less on one side of the fragments according to the following equation.

Shape rate=Diameter of circumscribed circle of a fragment (μm)/Diameter of inscribed circle of a fragment (μm)   [Equation 2]

Figure 3:
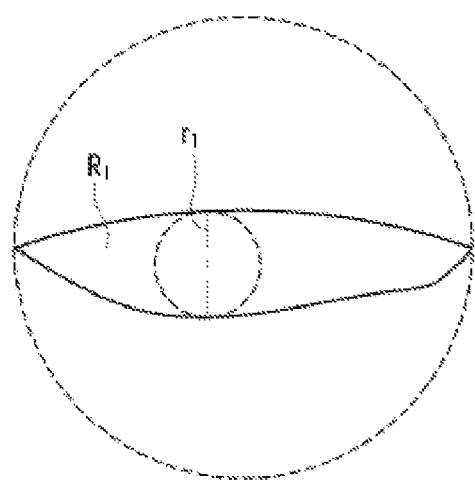
FIGS. 3 and 4 are diagrams showing diameters of the circumscribed circle and the inscribed circle of the fragments for evaluating the shape rate of the fragments of ferrite having irregular shapes.
Figure 4:
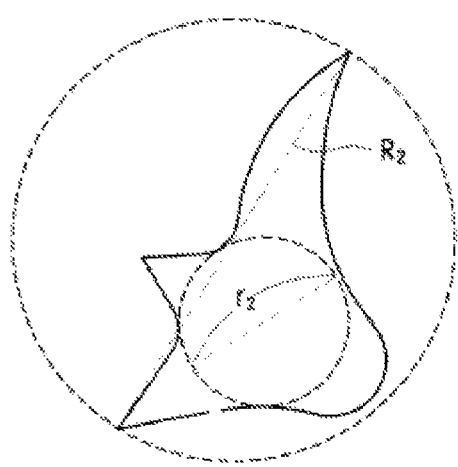

In Equation 2, the diameter of circumscribed circle of the fragment may mean the longest distance between any two points on one side of the fragment ($R_1$ in FIG. 3 and $R_2$ in FIG. 4), and a circle passing through two points of the fragment farthest from each other is the circumscribed circle of the fragment. The diameter of the inscribed circle of the fragment may mean the diameter of the inscribed circle having the largest diameter among the inscribed circles in contact with at least two sides present on any one side of the fragment ($r_1$ in FIG. 3, $r_2$ in FIG. 4). The large shape rate of one side of the fragments means that the shape of the one side of the fragments is long (refer to FIG. 3) or sharp (refer to FIG. 4). This means that additional breakage, and fragmentation the fragments may occur.

Accordingly, it is preferable that the number of the fragments having a large shape rate among the fragments of ferrite containing magnesium oxide 111 included in the magnetic field shielding layer 110 is less than a predetermined ratio. Accordingly, among all the fragments in the magnetic field shielding layer 110 the fragments having the shape rate of 8.0 or less according to Equation 2 may be included 30% or more, more preferably 45% or more, further preferably 60% or more. If the fragments having the shape rate of 8.0 or more among all the fragments in the magnetic field shielding layer 110 are less than 30%, the additional micro-fragmentation of the fragments of ferrite may occur, which may cause a significant deterioration of physical properties such as permeability, and may not maintain the desired initial designed values of physical property.

Meanwhile, the magnetic field shielding layer 110 according to the present disclosure may include the ferrite containing magnesium oxide as the magnetic material. The ferrite containing magnesium oxide may play a role of increasing the real part of the complex permeability and minimizing variance (maintaining or increasing) of the imaginary part. The magnetic field shielding layer may exhibit a magnetic field shielding property and a heat radiation property at the same time, and may have excellent in mechanical strength. There is an advantage that the magnetic field shielding layer may not be easily magnetized by the permanent magnet which is provided in the transmitting unit for aligning the magnetic field between the transmitting and receiving antennas. The ferrite produced by sintering at a low temperature, compared to the ferrite produced by high-temperature sintering, has a fine structure of the ferrite which is dense and uniform. Thus, an excellent permeability can be achieved. Further, the problem that the ferrite sheet is bent, which is problematic in the production of the ferrite which is sintered at high temperature, does not occur. The ferrite manufactured by low temperature sintering has almost no change in its shape after sintering and is superior to the high temperature sintered ferrite in applications.

In addition, the ferrite containing magnesium oxide included in one embodiment of the present disclosure may exhibit excellent magnetic characteristics at an operating frequency used for MST. Therefore, the ferrite containing magnesium oxide can remarkably improve efficiency and distance range of the transmission/reception of the signal for transmitting the magnetic security. In addition, the ferrite containing magnesium oxide can maintain or improve efficiency and distance range of the transmission/reception of the data signal even in the operating frequency used for the NFC. Furthermore, the ferrite containing magnesium oxide may guarantee excellent efficiency and distance range of the transmission of wireless power signal even in the operating frequency used for WPT. Different functions such as the MST, the NFC and the WPT may all be excellently exerted through the ferrite included in one embodiment of the present disclosure. Since the ferrite containing magnesium oxide may not need to be integrated with the heterogeneous magnetic materials for the exertion of all functions, it may be well suited for implementing slimmed shielding units, modules, and portable devices.

When the ferrite containing magnesium oxide is capable of exhibiting permeability properties of a magnetic field shielding unit described below in a fragmented state, there is no limitation on composition, crystal type, and microstructure of sintered particles. However, preferably, the crystal structure of ferrite containing magnesium oxide may be spinel type. In addition, the ferrite containing magnesium oxide may preferably include 3 mol % to 12 mol % of magnesium oxide. If the content of magnesium oxide is less than 3 mol %, the real part of the complex permeability is negligibly increased, so that the MST efficiency may not be improved. Thus, it may be difficult to satisfy all the desired physical properties. Further, if the content of magnesium oxide in the ferrite is more than 12 mol %, the saturation magnetic density may be lowered, the imaginary part of the complex permeability may increase at a greater rate than the real part of the complex permeability, and the temperature coefficient may be undesired value.

The ferrite may include 46 mol % to 52 mol % of iron trioxide. If the content of iron trioxide in the ferrite is more than 52 mol %, the contents of magnesium oxide, copper oxide, zinc oxide and nickel oxide, which will be described later, may be reduced, so that the desired level of magnetic properties by each component may not be exhibited. In addition, if the content of iron trioxide in ferrite is less than 46 mol %, the desired level of magnetic properties may not be exhibited.

In addition, the ferrite according to one embodiment of the present disclosure may further include copper oxide of 8 mol % to 14 mol %. The copper oxide may serve to lower the sintering temperature and grow the crystal grains. If the content of copper oxide in the ferrite is less than 8 mol %, the real part of the complex permeability may decrease at least one of the frequency bands used by the desired the NFC, WPT, and MST. If the content of copper oxide in the ferrite is included more than 8 mol %, the grain growth during sintering may not be normal and the imaginary part of the complex permeability may be remarkably increased.

The ferrite may further include zinc oxide of 25 mol % to 32 mol % and nickel oxide of 1 mol % to 10 mol %. If the content of nickel oxide in the ferrite is less than 1 mol %, the real part of complex permeability at 100 kHz frequency may be lowered. In particular, the resonance frequency of the complex permeability may shift to the low frequency side, and the real part of the complex permeability may decrease at the frequency of the NFC. As the imaginary part of the complex permeability is significantly increased, the efficiency of the NFC may be significantly lowered, so that it may be impossible to simultaneously improve several functions such as MST and NFC with a single magnetic shielding unit. When the content of nickel oxide in the ferrite is more than 10 mol %, the real part of the complex permeability may decrease considerably over the low-frequency band and the high-frequency band, and various functions such as MST and NFC may not be simultaneously improved. If the content of nickel oxide in the ferrite is more than 32 mol %, the imaginary part of the complex permeability significantly may increase at least one frequency band among the frequency bands used for the intended the NFC, WPT, and MST. In addition, magnetic loss and heat generation due to eddy currents may occur.

On the other hand, the value of the nickel oxide and zinc oxide may be 3.6 or more, and more preferably 12 or less according to the following equation.

Content of zinc oxide in ferrite (mol %)/Content of nickel oxide in ferrite (mol %) [Equation 1]

If the value calculated using Equation 1 is less than 3.6, the imaginary part of the complex permeability may be lowered at a frequency of 100 kHz to 200 kHz. However, the real part of the complex permeability may be greatly deteriorated and the desired level of physical properties may not be exhibited.

The ferrite according to an embodiment of the present disclosure may include iron trioxide of 47 mol % to 51 mol %, nickel oxide of 3 mol % to 8 mol %, zinc oxide of 26 mol % to 30 mol %, copper oxide of 9 mol % to 12 mol %, and magnesium oxide of 6 mol % to 11 mol %. These compositions may be more advantageous to manifest all desired properties. On the other hand, compositions and ratio of the compositions of the ferrite containing magnesium oxide may not be limited thereto, and may be changed according to the degree of desired physical properties.

The thickness of the magnetic shielding layer 110 may be a thickness of the ferrite sheet derived from the fragments of ferrite containing magnesium oxide 111, and may be 30 μm to 600 μm. If the average thickness is less than 30 μm, the magnetic properties may not be obtained to the desired level. If the average thickness is more than 600 μm, it may be hard to get the slimness of shielding unit.

In addition, the magnetic field shielding layer may be formed in a shape a polygon such as a pentagon, a circle, an ellipse, or a shape in which a curve and a line are partially mixed, as well as a tetragon such as a rectangle or a square. The shape of the magnetic field shielding layer may correspond to a shape of an application to which the magnetic field shielding unit is applied, specifically, the MST antenna, the WPT antenna, and/or the NFC antenna. At this time, the size of the magnetic field shielding unit may be preferably about 1 mm to 2 mm larger than the antenna size of the corresponding module.

As shown in FIG. 1, the protective member 140 having a base film 140a and a second adhesive layer 140b formed on a surface of the base film 140a may be disposed on the top surface of the magnetic field shielding layer 110. The first adhesive member 130 having a releasing film 130a and a first adhesive layer 130b formed on a side of the releasing film 130a may be disposed on the bottom surface of the magnetic field shield layer 110.

First, the base film 140a of the protective member 140 may be the protective film typically provided in the magnetic field shielding unit. The base film 140a needs to have heat resistance sufficient to withstand the heat/pressure applied for hardening in the step of attaching the magnetic field shielding sheet to a substrate having the radiator. In addition, the base film 140a also needs to have mechanical strength and chemical resistance sufficient to protect the magnetic field shielding layer 110 or 110' against external physical and chemical stimuli. Any film which can meet such characteristics may be used without limitation. As non-limiting examples, the raw material of the base film 140a of the protective member 140 may include polyethylene, polypropylene, polyimide, crosslinked polypropylene, nylon, polyurethane resin, acetate, polybenzimidazole, polyimideamide, polyetherimide, polyphenylene sulfide (PPS), polyethylene terephthalate (PET), polytrimethylene terephthalate (PTT), polybutylene terephthalate (PBT), polyvinylidene fluoride (PVDF), polytetrafluoroethylene (PTFE), polychlorotrifluoroethylene (PCTFE), and polyethylene tetrafluoroethylene (ETFE) and the like, which may be used alone or in combination.

The base film 140a may have a thickness of 1 μm to 100 μm, preferably 10 μm to 30 μm, but is not limited thereto.

The protective member 140 may include the second adhesive layer 140b on a surface of the base film 140a. The protective member 140 may be adhered to the magnetic field shielding layer 110 through the second adhesive layer 140b. The second adhesive layer 140b may be a conventional adhesive layer without limitation and may be a double-sided tape-type adhesive layer formed as a single layer through an adhesive layer forming composition or an adhesive layer forming composition formed on both sides of a supporting film. The thickness of the first adhesive layer 140b may be in the range of 3 μm to 50 μm, but is not limited thereto and may be changed according to the purpose of use.

Next, the adhesive member 130 may function to attach the magnetic field shielding unit 100 or 100' to the antenna or a substrate provided with the antenna. As shown in FIG. 1, the adhesive member 130 may include the first adhesive layer 130b for attaching the magnetic field shielding unit 100, or 100' to a surface to be attached and further include the releasing film 130a for protecting the first adhesive layer 130b. A conventionally known releasing film which can be easily removed from the first adhesive layer 130b may be used as the releasing film 130a without limitation, but the present disclosure is not particularly limited thereto.

The first adhesive layer 130b may be formed by applying an adhesive composition to the bottom surface of the magnetic field shielding layer 110 or 110'. The first adhesive layer 130b formed by applying an adhesive composition on the releasing film 130a may be attached to the magnetic field shielding layer 110 or 110'. Alternatively, the first adhesive layer 130b may be a double-sided adhesive member coated with an adhesive agent on both sides of the film-like supporting substrate for reinforcement of mechanical strength. The thickness of the first adhesive layer 130b may be 3 μm to 50 μm, but the present disclosure is not limited thereto and may be modified according to the purpose.

Meanwhile, the magnetic field shielding units 100 and 100' according to the present disclosure may include ferrite containing magnesium oxide from the beginning to form a magnetic field shielding layer. Nevertheless, the characteristics of antennas for MST can be significantly improved. In the bulk state ferrite containing magnesium oxide for condensing the magnetic field toward the antenna, the real part ($\mu'$) of the complex permeability at the frequency of 100 kHz may be 650 or more, preferably 830 or more, and even more preferably 1400 or less. Further, preferably, the imaginary part ($\mu''$) of the complex permeability at the frequency may be 50.0 or less.

If the real part of the complex permeability at the 100 kHz frequency is less than 650, the desired MST efficiency may not be achieved and the transmission/reception distance range may be significantly reduced. Further micro fragmentation of the fragments of ferrite may fail to satisfy the physical properties required for the MST, and it may result in defective products. In addition, when it is intended to simultaneously use the MST as well as the WPT, the WPT performance of a desired level may not be exhibited. In addition, when the real part of the complex permeability exceeds 1400, the desired physical properties may not be achieved due to a large increasing of the imaginary part. On the other hand, when the imaginary part of the complex permeability exceeds 50 at the frequency, the transmission efficiency/distance range of the magnetic security data signal and the WPT signal may not be achieved to a desired level even if the real part of the complex permeability is large.

In order to further improve the characteristics of the MST antenna, the bulk ferrite containing magnesium oxide included in the magnetic field shield unit according to an embodiment of the present disclosure may satisfy a quality index value of 29.0 or more at a frequency of 100 kHz according to following Equation 3.

A quality index value=a real part of complex permeability at a predetermined frequency ($\mu'$)÷an imaginary part of complex permeability at a predetermined frequency ($\mu''$)

The increasing of the quality index value according to Equation 3 means that the real part of the complex permeability is increased and the imaginary pat of the complex permeability is no change. Alternatively, the real part of the complex permeability is constant and the imaginary part of the complex permeability may be decreased. Alternatively, the real part of the complex permeability is increased and the imaginary part of the complex permeability is decreased at the same time. In any case, the signal transmission/reception efficiency and transmission/reception distance can be increased. If the quality index value is less than 29.0 at a frequency of 100 kHz, the MST efficiency may not be achieved at the desired level, and the WPT performance may also be not achieved at the desired level.

In case of the ferrite containing magnesium oxide, the real part ($\mu'$) of the complex permeability may be less than 650 at a frequency of 200 kHz and the real part ($\mu'$) of the complex permeability may be 140 to 236 at a frequency of 13.56 MHz. More preferably, the imaginary part ($\mu''$) of the complex permeability may be 50 or less at a frequency of 200 kHz, and the imaginary part ($\mu''$) of the complex permeability may be 400 or less at the frequency of 13.56 MHz. These combination may make it possible to transmit the MST signal, the WPT signal and the NFC signal with better efficiency so that the magnetic field shielding unit according to the present disclosure may exert various desired functions at the same time with excellent performance.

Meanwhile, the WPT may be applied to the Qi scheme, or the WPT of PMA scheme in which a part of the magnetic force lines generated from the permanent magnets are induced through an attractor (not shown). In addition, the present disclosure may be applied to a magnetic resonance method based WPT in which WPT is performed at a frequency of several tens kHz to 6.78 MHz.

The magnetic field shielding unit according to an embodiment of the present disclosure may be manufactured by a manufacturing method described below, but the present disclosure may not be limited thereto.

First, the step (a) of preparing a ferrite sheet containing magnesium oxide may be performed. Since the ferrite sheet containing magnesium oxide may be produced by a conventional method producing the ferrite sheet, the present disclosure is not limited thereto. As an example of the manufacturing method, nickel oxide, zinc oxide, copper oxide, magnesium oxide, and iron trioxide may be mixed in a predetermined composition ratio to obtain a raw material mixture. At this time, the mixture may be mixed by dry mixing or wet mixing, and the particle diameter of the raw material to be mixed may be preferably 0.05 µm to 5 µm. The components such as magnesium oxide, nickel oxide, and zinc oxide contained in the raw material mixture may be the component itself or in the form of a composite oxide containing the components.

Next, the raw material mixture is subjected to plasticity to obtain a plastic material. The plasticity may be carried out in order to promote a paralysis of raw material, a homogenization of components, a generation of ferrite, a disappearance of ultrafine powder by sintering, and grain growth to an appropriate degree of particle size, thereby converting the raw material mixture into suitable form for post-processing. The sintering may be preferably carried out at a temperature of 800° C. to 1100° C. for 1 to 3 hours. The preliminary plasticity may be performed in an air atmosphere or an atmosphere having a higher oxygen partial pressure instead the air atmosphere.

Next, the obtained sintered material is grinded to obtain a grinded material. The grinding may be carried out to break lumps of the sintered material to obtain a powder having an appropriate degree of sintering property. When the sintered material is large lumps, a wet grinding using a boll mill, an attritor mill or the like may be carried out after the rough grinding. The wet grinding may be carried out until the average particle diameter of the grinded material becomes preferably about 0.5 µm to 2 µm.

Thereafter, the ferrite sheet containing magnesium oxide may be produced through the obtained grinding material. A known method may be used for producing the ferrite sheet, which is not particularly limited in the present disclosure. As a non-limiting example, the obtained grinding material may be subject to a slurring processing together with additive agents such as a solvent, a binder, a dispersant, and a plasticizer to produce a paste. Using this paste, a ferrite sheet having a thickness of 30 µm to 600 µm may be formed. After the ferrite sheet is processed into a predetermined shape, the ferrite sheet may be produced though a binder removal process and a plastic process. The sintering process may be carried out preferably at a temperature of 900° C. to 1300° C. for 1 to 5 hours. The sintering process may be performed in an air atmosphere or an atmosphere having a higher oxygen partial pressure than the air atmosphere. The sintered body after sintering the produced ferrite sheet may have a density of 5.0 g/cm$^3$ to 5.3 g/cm$^3$.

On the other hand, as another embodiment for producing the ferrite sheet containing magnesium oxide, the ferrite powder and the binder resin may be mixed and then manufactured by a known method such as a powder compression molding method, an injection molding method, a calendar method and an extrusion method, etc.

Next, the step (b) of forming the magnetic field shielding layer formed of fragments of ferrite may be carried out by shredding the ferrite sheet including the produced magnesium oxide.

In one embodiment of the step (b), the protective member 140 having the second adhesive layer 140b may be attached to one surface of the ferrite sheet. A lamination body attached the first adhesive member 130 having the first adhesive layer 130b formed on the other surface may be passed through a shredding device so that the ferrite sheet may be sliced into amorphous fragments. Thereafter, a pressure may be applied to the lamination body to adjust the particle size and the degree of deformation of the desired fragments to improve flexibility, thereby preventing further damage, fracture, and micro-fragmentation of the fragments. In the case of the shredding device as shown in FIG. 5, the particle size and the shape rate of the shredded fragments may be adjusted by an interval between unevenness, a shape of the unevenness, and the like.

Figure 5:
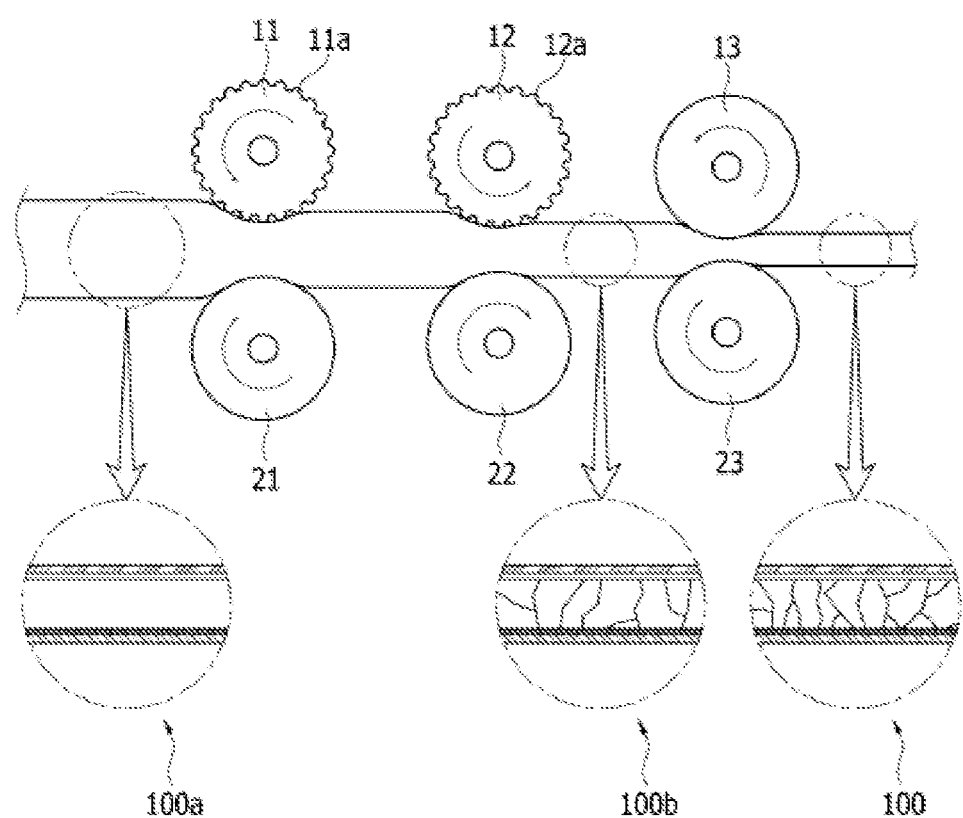
FIG. 5 and FIG. 6 are schematic views illustrating a manufacturing process using a shredding device used for manufacturing a magnetic field shielding unit according to an embodiment of the present disclosure. In detail.

Specifically, as shown in FIG. 5, the lamination body 100a may be passed through the shredding device provided with the first rollers 11 and 12 having the unevenness 11a and 12a and the second rollers 21 and 22 corresponding to the first rollers 11 and 12, respectively. After lamination body 100a may be shredded, the lamination body 100b may be further broken through the third roller 13 and the fourth roller 23 corresponding to the third roller 13 to form the magnetic field shielding unit 100.

Figure 6:
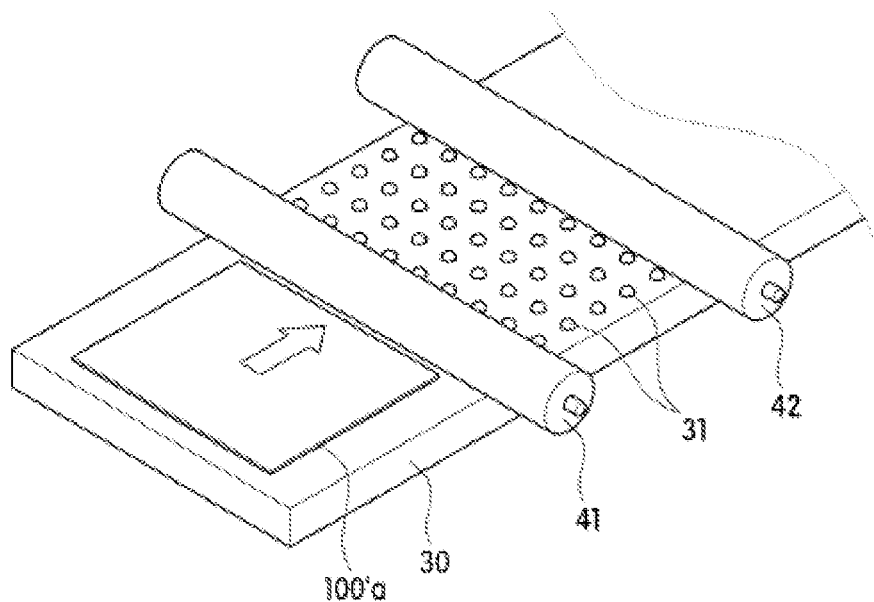

As shown in FIG. 6, the lamination body 100a including the ferrite sheet may be fed into the shredding device which is provided with a support plate 30 having a plurality of metal balls 31 on one surface thereof and rollers 41 and 42 disposed on the upper portion of the support plate 30 for moving the ferrite sheet to be shredded. Pressure may be applied through the metal ball 31 to shred the ferrite sheet. The shape of the metal ball 31 may be spherical, but is not limited thereto, may be a triangle, a polygon, an ellipse, or the like. The shape of the metal ball 31 formed on the first roller may be one shape or a mixture of various shapes.

Figure 7:
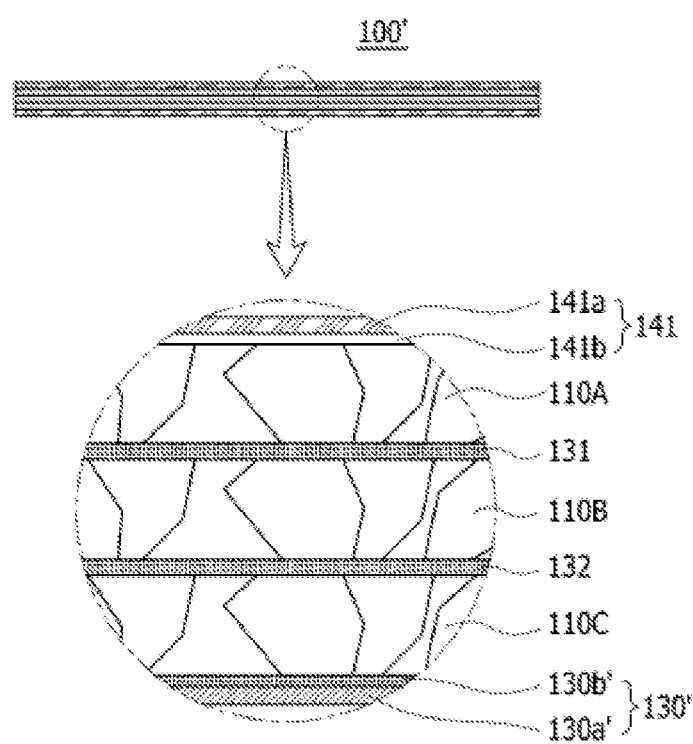
FIG. 7 is a cross-sectional view of a magnetic field shielding unit for MST according to an embodiment of present disclosure having a magnetic field shielding layer including three layers formed of the fragments of ferrite.

On the other hand, as shown in FIG. 7, the above-mentioned magnetic-field shielding layer may be provided in the magnetic-field shielding unit 100" as a plurality of 110A, 110B, and 110C. The second adhesive members 131 and 132 may be interposed between adjacent magnetic shield layers 110A/110B and 110B/110C.

It may be difficult to achieve an improved signal transmission and reception efficiency and distance range over a desired level when only a single magnetic field shielding layer is provided according to the specific case in which the magnetic field shielding unit is applied. That is, a method of increasing the magnetic property of the magnetic field shielding unit itself may include a way of using a magnetic body having excellent physical properties such as permeability at a desired frequency, a way of increasing the thickness of the magnetic field shielding layer, and the like. When the thickness of the ferrite sheet of the single layer is increased to a certain level or more in order to increase the thickness of the magnetic field shielding layer, the surface portion and the inside of the sheet are not uniformly sintered in the sintering process. The magnetic permeability due, to non-uniform sintered structure may be decreased. Thus, there is a limit to increase the permeability through the increasing of the thickness of the magnetic field shielding layer of the single layer. Accordingly, it is possible to achieve a high permeability increasing effect by increasing the overall thickness of the magnetic field shielding layer by providing a plurality of the magnetic field shielding layers themselves. The magnetic shielding unit having the laminated magnetic shielding layers may further improve the characteristics of the antennas for MST, WPT, and data transmission/reception.

When a plurality of the magnetic field shielding layers 110A, 110B, and 110C are provided in the magnetic field shielding unit 100", the number of the magnetic field shielding layers may be preferably 2 to 12. However, the present disclosure is not limited thereto.

When a plurality of magnetic shielding layers 110A, 110B and 110C are provided, the second adhesive members 131 and 132 may be interposed between adjacent magnetic shielding layers 110A/110B and 110B/110C. The second adhesive members 131 and 132 may function to improve the flexibility of the shielding unit, to prevent further micro-fragmentation of fragments, and to prevent oxidation of fragments of ferrite due to penetration of moisture. The second adhesive members 131 and 132 may be the same as the first adhesive member described above. That is, the second adhesive member may be a double-sided adhesive member coated with an adhesive composition on both sides of the supporting substrate. That is, the second adhesive member may be formed by applying the adhesive composition to the one magnetic field shielding layer without the supporting substrate for thinning the shielding unit, and stacking another magnetic field shielding layer on the one shielding layer.

In another embodiment, the second adhesive members 131 and 132 may be a heat-radiating adhesive layer. The heat-radiating adhesive layer may be formed by mixing a known heat radiating filler such as nickel, silver, or carbon with an adhesive component such as acrylic, urethane, epoxy or the like. Since the specific composition and content may be determined according to known composition and content, it is not particularly limited in the present disclosure.

When a plurality of the magnetic field shielding layers 110A, 110B, and 110C are provided, the composition of the ferrite included in the respective magnetic field shielding layer may be the same or different from each other. Also, even though the composition is the same, the magnetic shielding layers may have different magnetic permeability due to the difference in the heat treatment time and the like. The thickness of each of the magnetic field shielding layers may be the same or different from each other depending on the purpose.

In the meantime, the magnetic field shielding unit 100, 100', or 100" for WPT according to the above-described embodiments of the present disclosure may include at least one functional layer (not shown) for shielding the electromagnetic waves and/or radiating the heat. Accordingly, the magnetic field shielding unit having the functional layer may prevent the frequency fluctuation range of the antenna, which is combined due to the electromagnetic wave such as power supply noise, from being significantly increased, thereby reducing the defecting rate of the antenna. It is also possible to prevent a deterioration of durability of components due to heat generation, a deterioration of function, and a discomfort caused by heat transfer to the user.

In addition, if the functional layer provided on the top and/or bottom of the magnetic field shielding unit has a heat-radiating function, the thermal conductivity of the magnetic field shielding unit in the horizontal direction may be improved.

Specifically, a functional layer such as an electromagnetic wave shielding layer, a heat radiating layer, and/or a composite layer in which these are stacked or a composite layer in which these layers are combined as a single layer may be provided on the upper portion of the protective member 130 of the magnetic field shielding layer 100 and/or on lower portion of the adhesive member 140. For example, a metal foil such as copper, aluminum, or the like, which is excellent in thermal conductivity and conductivity, may be attached to the upper portion of the protective member 130 through an adhesive agent or a double-sided tape. Or, Cu, Ni, Ag, Al, Au, Sn, Zn, Mn, Mg, Cr, Tw, Ti or the combination of these metals may be formed on the protective member 130 by a known method such as sputtering, vacuum deposition, chemical vapor deposition, or the like to form a metal thin film. When the functional layer is provided through an adhesive agent, the adhesive agent may be a known adhesive agent. As a non-limiting example, acrylic-based, urethane-based or epoxy-based adhesives may be used. On the other hand, a heat radiating function may be added to the above adhesive agent. For this purpose, known filler such as nickel, silver or carbon material may be mixed with the adhesive agent. The content of the filler may be such that the adhesive agent performance of the adhesive agent may not be deteriorated and the heat radiating performance can be exhibited. But the filler is not particularly limited thereto.

In addition, the thickness of the functional layer may be in the range of 5 µm to 100 µm, and more preferably 10 µm to 20 µM in order to reduce the thickness of the magnetic field shielding unit.

Figure 8:
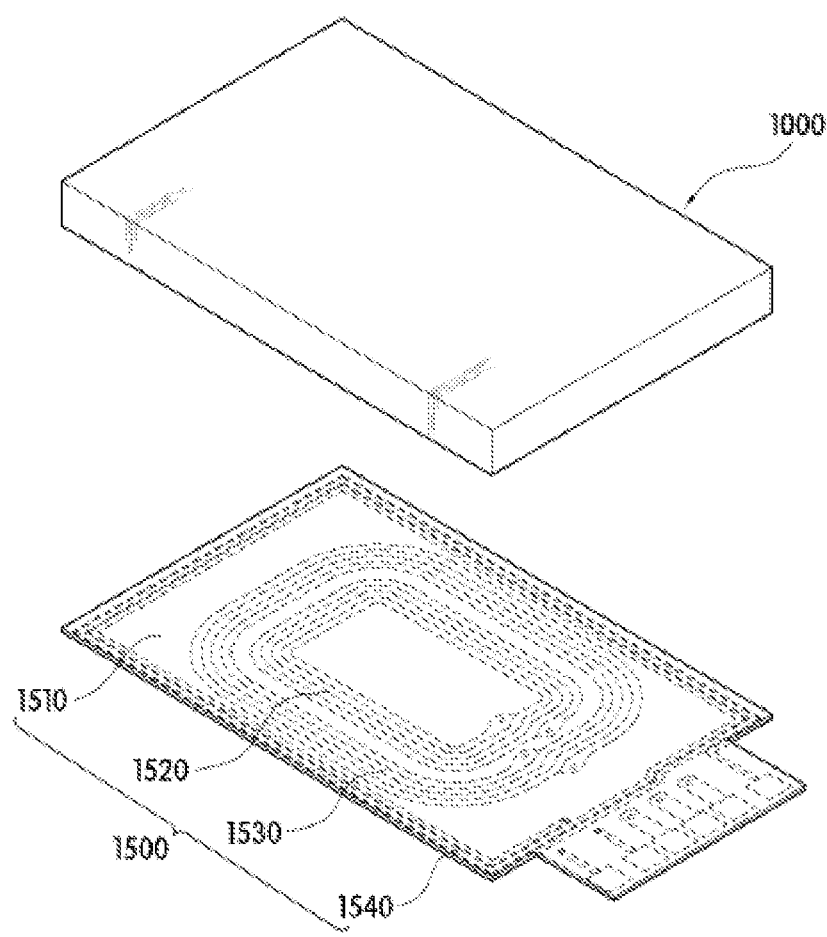
FIG. 8 is an exploded perspective view of a MST module according to an embodiment of the present disclosure.

As shown in FIG. 8, the magnetic field shielding unit 1000 for MST according to an embodiment of the present disclosure may be provided on one side of the antenna unit to implement the MST module including the WPT antenna 1540, the MST antenna 1530, and the NFC antenna 1520.

Here, the MST module may be a transmission module that transmits power/signals to the electronic device, or a reception module that receives power/signals from the transmission module. Each of the antennas 1520, 1530, and 1540 may be an antenna coil wound with a coil having a predetermined inner diameter, or may be an antenna pattern printed with an antenna pattern on a substrate. Size, material, etc. are not particularly limited in the present disclosure. As shown in FIG. 8, the antenna unit 1500 includes the NFC antenna 1520 provided at the outermost portion of the circuit board 1510, and the plurality of NFC antenna 1530 for MST, and the WPT antenna 1540.

Meanwhile, the MST module according to the embodiment of the present disclosure does not have a WPT antenna 1540, unlike the configuration shown in FIG. 8. The NFC antenna 1520, and the MST antenna 1530 may be implemented as the MST module or may be implemented as the MST module without the WPT antenna 1540 and the NFC antenna 1520.

THE EMBODIMENTS OF PRESENT DISCLOSURE

The present disclosure will now be described more specifically with reference to the following embodiment of exemplary examples. However, the following the embodiment of exemplary examples should not be construed as limiting the scope of the present disclosure, and should be construed to facilitate understanding of the present disclosure.

First, the following preparation examples were carried out in order to evaluate the physical properties according to the composition of the ferrite magnetic material.

Preparation Example 1

10 parts by weight of polyvinyl alcohol relative to 100 parts by weight of a ferrite powder having an average particle diameter of 0.75 µm (48.5 mol % of Fe2O3, 4.1 mol % of NiO, 28.8 mol % of ZnO, 10.3 mol % of CuO and 8.2 mol % of MgO) 50 parts by weight were mixed, dissolved and dispersed in a ball mill. Thereafter, the mixture was charged into a mold having cylindrical holes each having a diameter of 0.5 mm and a height of 0.5 mm and press-molded to produce granules. The granules thus prepared were molded into a mold having a final molding density of 3.2 g/cm 3 with an outer diameter of 18 mm, an inner diameter of 13 mm, and a thickness of 3.7 mm, followed by degreasing at 500 for 10 hours and calcining at 940 for 2.2 hours and cooled to produce bulk ferrite.

Preparation Examples 2 to 14

The ferrite powder was prepared in the same manner as in Preparation Example 1 except that the composition/composition ratio of the ferrite powder was changed as shown in Table 12 to prepare bulk ferrite as shown in Table 1 below.

Comparative Preparation Examples 1 to 2

The ferrite powder was prepared in the same manner as in Preparation Example 1 except that the composition/composition ratio of the ferrite powder was changed as shown in Table 2 to prepare bulk ferrite as shown in Table 2 below.

Experimental Example

The real and imaginary parts of the complex permeability were shown in Tables 1 to 2 by measuring the permeability at 100 kHz, 200 kHz and 13.56 MHz for the samples prepared according to the preparation examples and comparative preparation examples.

Specifically, the permeability was measured using an impedance analyzer (4294A Precision Impedance Analyzer and 42942A Terminal adapter kit). The test fixture was a 16454A magnetic body test fixture and measured at an Osc level of 500 mV.

TABLE 1

| | | Prep. Ex. 1 | Prep. Ex. 2 | Prep. Ex. 3 | Prep. Ex. 4 | Prep. Ex. 5 | Prep. Ex. 6 | Prep. Ex. 7 | Prep. Ex. 8 | Prep. Ex. 9 | Prep. Ex. 10 |
|---|---|---|---|---|---|---|---|---|---|---|---|
| Composition of Ferrite | $Fe_2O_3$ | 48.5 | 48.5 | 49.3 | 49.3 | 48.5 | 48.5 | 49.3 | 49.3 | 49.3 | 49.3 |
| | NiO | 4.1 | 4.6 | 4.6 | 2.5 | 3.1 | 3.6 | 5.6 | 6.6 | 7.6 | 7.1 |
| | ZnO | 28.8 | 28.3 | 27.9 | 27.9 | 29.9 | 29.3 | 27.9 | 27.9 | 27.9 | 25.4 |
| | CuO | 10.3 | 10.3 | 10.1 | 11.2 | 10.3 | 10.3 | 10.1 | 10.1 | 10.1 | 10.1 |
| | MgO | 8.2 | 8.2 | 8.1 | 9.1 | 8.2 | 8.2 | 7.1 | 6.1 | 5.1 | 8.1 |
| | Total | 100 | 100 | 100 | 100 | 100 | 100 | 100 | 100 | 100 | 100 |
| | ZnO (Mol %)/ NiO (Mol%) | 7.02 | 6.15 | 6.06 | 11.16 | 9.65 | 8.14 | 4.98 | 4.23 | 3.67 | 3.58 |

TABLE 1-continued

|  |  | Prep. Ex. 1 | Prep. Ex. 2 | Prep. Ex. 3 | Prep. Ex. 4 | Prep. Ex. 5 | Prep. Ex. 6 | Prep. Ex. 7 | Prep. Ex. 8 | Prep. Ex. 9 | Prep. Ex. 10 |
|---|---|---|---|---|---|---|---|---|---|---|---|
| Density of Ferrite (g/cm$^3$) | | 5.08 | 5.09 | 5.06 | 5.1 | 5.07 | 5.09 | 5.08 | 5.1 | 5.15 | 5.08 |
| Permeability (100 KHz) | Real part | 1171 | 1084 | 1211 | 1318 | 1200 | 1220 | 1152 | 1081 | 1060 | 727 |
| | Imaginary part | 16 | 14 | 19 | 44 | 21 | 17 | 16 | 14 | 11 | 8 |
| Permeability (200 KHz) | Real part | 1171 | 1065 | 1208 | 1309 | 1202 | 1220 | 1150 | 1079 | 1058 | 724 |
| | Imaginary part | 22 | 18 | 22 | 41 | 30 | 26 | 19 | 17 | 15 | 8 |
| Permeability (13.56 MHz) | Real part | 178 | 190 | 195 | 189 | 144 | 164 | 201 | 210 | 219 | 217 |
| | Imaginary part | 336 | 337 | 364 | 360 | 304 | 327 | 363 | 365 | 374 | 328 |

(Prep. Ex.: Preparation Example)

TABLE 2

|  |  | Prep. Ex. 11 | Prep. Ex. 12 | Prep. Ex. 13 | Prep. Ex. 14 | Comp. prep. Ex. 1 | Comp. prep. Ex. 2 |
|---|---|---|---|---|---|---|---|
| Composition of Ferrite | Fe$_2$O$_3$ | 48.5 | 48.5 | 48.5 | 48.5 | 49.3 | 48.5 |
| | NiO | 10.6 | 9.6 | 1.5 | 0.7 | 9.6 | 13.1 |
| | ZnO | 28.3 | 28.3 | 28.3 | 28.3 | 22.8 | 28.3 |
| | CuO | 10.1 | 10.1 | 10.1 | 10.1 | 10.1 | 10.1 |
| | MgO | 2.5 | 3.5 | 11.6 | 12.4 | 8.1 | 0 |
| | Total | 100 | 100 | 100 | 100 | 100 | 100 |
| | ZnO (Mol %)/NiO (Mol %) | 2.7 | 2.9 | 18.9 | 40.4 | 2.4 | 2.2 |
| Density of Ferrite (g/cm$^3$) | | 5.21 | 5.18 | 5.03 | 5.02 | 5.07 | 5.23 |
| Permeability (100 KHz) | Real part | 718 | 796 | 1227 | 1262 | 472 | 657 |
| | Imaginary part | 71 | 51 | 23 | 38 | 6 | 87 |
| Permeability (200 KHz) | Real part | 722 | 798 | 1230 | 1263 | 469 | 661 |
| | Imaginary part | 70 | 63 | 25 | 28 | 5 | 93 |
| Permeability (13.56 MHz) | Real part | 329 | 287 | 185 | 184 | 239 | 412 |
| | Imaginary part | 342 | 341 | 334 | 332 | 279 | 368 |

As can be seen from Tables 1 and 2 above, it can be confirmed that the real part of the complex permeability is lower and the imaginary part is significantly higher than the preparation examples in Comparative Preparation Example 2 using ferrite not containing magnesium oxide.

In Comparative Preparation Example 1, it can be confirmed that the real part of the complex permeability does not satisfy 650 at a frequency of 100 kHz according to the composition ratio of nickel oxide, zinc oxide and copper oxide.

Further, in the case of Preparation Example 19 in which the content ratio of zinc oxide and nickel oxide is less than 3.6, it can be confirmed that the real part difference of the complex permeability is remarkable at the frequency of 100 kHz as compared to Preparation Example 9

It is also expected that Preparations Examples 1 to 10, 12, and 13 satisfying the preferable content range of magnesium oxide have a larger real and/or imaginary number of complex permeability than Preparative Example 11 and Preparative Example 13.

Example Embodiment 100 parts by weight of ferrite powder having an average particle diameter of 0.75 mum (48.5 mol % of Fe2O3, 4.1 mol % of NiO, 28.8 mol % of ZnO, 10.3 mol % of CuO and 8.2 mol % of MgO) 5 parts by weight of Lal resin, and 50 parts by weight of a solvent in which toluene and ethanol were mixed in a ratio of 5:5 were mixed, dissolved and dispersed in a ball mill. Thereafter, the ferrite mixture was made into a sheet shape through a conventional tape casting method, followed by degreasing at 500 for 10 hours and calcining and cooling at 940 for 2.2 hours to prepare a ferrite sheet having a final thickness of 80 μm.

Then, a double-sided tape (support base PET, CYWON CORPORATION, VT-8210C) having a thickness of 10 μm and attached with a release film was attached to one surface of the ferrite sheet. Thereafter, a PET protective member (International Latex, KJ-0714) having a thickness of 7 μm and an adhesive layer formed on one surface was attached to one surface of the laminated ribbon sheet. As shown in FIG. 5, the shredded device was passed three times to manufacture a magnetic shielding unit.

As described above, the present disclosure has been described with respect to particularly preferred embodiments. However, the present disclosure is not limited to the above embodiments, and it is possible for one who has an ordinary skill in the art to make various modifications and variations, without departing off the spirit of the present disclosure.

What is claimed is:

1. A magnetic field shielding unit for magnetic security transmission comprising;
   a magnetic field shielding layer including fragments of ferrite containing magnesium oxide (MgO) shredded to improve flexibility of the magnetic field shielding unit,
   wherein the ferrite containing magnesium oxide has a real part (μ') of complex permeability of 650 or more at a frequency of 100 kHz, wherein the ferrite containing magnesium oxide has an imaginary part ($\mu''$) of the complex permeability of 50 or less at a frequency of 100 kHz, wherein the ferrite includes a magnesium oxide of 3 mol % to 12 mol %, and further includes a copper oxide of 8 mol % to 14 mol %, a nickel oxide and a zinc oxide, and wherein contents of the nickel oxide and the zinc oxide are values such that a ratio calculated by following Equation 1 is 3.6 or more.

Content of zinc oxide in ferrite (mol %)/Content of nickel oxide in ferrite (mol %) [Equation 1]

2. The magnetic field shielding unit for magnetic security transmission of claim 1, further comprising a protective member disposed on one surface of the magnetic field shielding layer, and an adhesive member disposed on the other surface of the magnetic field shielding layer.

3. The magnetic field shielding unit for magnetic security transmission of claim 1, wherein the ferrite containing magnesium oxide has a real part ($\mu'$) of the complex permeability of 650 or more at a frequency of 200 kHz, and a real part ($\mu'$) of the complex permeability of 140 to 236 at a frequency of 13.56 MHz.

4. The magnetic field shielding unit for magnetic security transmission of claim 1, wherein number of fragments of ferrite having a curved shape at least one side of which is not a straight line but a curved line is 45% or more of a total number of the fragments of ferrite.

5. The magnetic field shielding unit for magnetic security transmission of claim 1, wherein the ferrite containing magnesium oxide has an imaginary part ($\mu''$) of the complex permeability of 50 or less at a frequency of 200 kHz, and an imaginary part ($\mu''$) of the complex permeability of 400 or less at a frequency of 13.56 MHz.

6. The magnetic field shielding unit for magnetic security transmission of claim 1, wherein the ferrite includes a magnesium oxide of 3 mol % to 12 mol % and an iron oxide of 46 weight % to 52 weight %, and further includes a copper oxide 8 mol % to 14 mol %, a nickel oxide of 1 mol % to 10 mol %, and a zinc oxide of 25 mol % to 32 mol %.

7. The magnetic field shielding unit for magnetic security transmission of claim 1, wherein the fragments of ferrite includes 30% or more fragments of ferrite having a shape rate of 8.0 or less according to the following Equation 2.

Shape rate=Diameter of circumscribed circle of a fragment (µm)/Diameter of inscribed circle of a fragment (µm) [Equation 2]

8. The magnetic field shielding unit for magnetic security transmission of claim 1, wherein the ferrite including the magnesium oxide has a real part ($\mu'$) of the complex permeability of 1000 or more at a frequency of 100 kHz.

9. A magnetic security transmission module, comprising;
an antenna unit including a magnetic security transmission antenna; and
a magnetic field shielding unit for magnetic security transmission, according to claim 1, disposed on one surface of the antenna unit to improve characteristics of the antenna and condense a magnetic field toward the antenna.

10. The magnetic security transmission module of claim 9, wherein the antenna unit further includes at least one of a wireless power transmission (WPT) antenna and a near field communication (NFC) antenna.

11. A portable device according to claim 10 including a magnetic security transmission module as a receiving module.

* * * * *